(12) United States Patent
Lei

(10) Patent No.: US 10,451,666 B2
(45) Date of Patent: Oct. 22, 2019

(54) METHODOLOGY FOR EARLY DETECTION OF TS TO PC SHORT ISSUE

(71) Applicant: GLOBALFOUNDRIES Inc., Grand Cayman (KY)

(72) Inventor: Ming Lei, Ballston Lake, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 844 days.

(21) Appl. No.: 14/989,109

(22) Filed: Jan. 6, 2016

(65) Prior Publication Data

US 2017/0192050 A1 Jul. 6, 2017

(51) Int. Cl.
| | |
|---|---|
| *G01R 31/28* | (2006.01) |
| *H01L 21/66* | (2006.01) |
| *H01L 27/11* | (2006.01) |
| *G01R 31/27* | (2006.01) |
| *G01R 31/307* | (2006.01) |

(52) U.S. Cl.
CPC ........ *G01R 31/2812* (2013.01); *H01L 22/14* (2013.01); *H01L 22/20* (2013.01); *H01L 27/1104* (2013.01); *G01R 31/275* (2013.01); *G01R 31/307* (2013.01); *H01L 22/12* (2013.01)

(58) Field of Classification Search
CPC ......... H01L 22/34; H01L 22/14; H01L 22/20; H01L 22/12; H01L 22/24; H01L 27/1104; G01R 31/311; G01R 31/307; G01R 31/2812; G01R 31/275; G03F 7/70633
See application file for complete search history.

(56) References Cited

U.S. PATENT DOCUMENTS

| | | | |
|---|---|---|---|
| 8,736,084 B2* | 5/2014 | Cheng | H01L 22/12 257/797 |
| 2007/0222470 A1* | 9/2007 | Patterson | G01R 31/2632 324/754.22 |
| 2009/0196490 A1* | 8/2009 | Matsumiya | G06K 9/00 382/149 |

(Continued)

FOREIGN PATENT DOCUMENTS

| | | |
|---|---|---|
| CN | 101630623 B | 2/2012 |
| CN | 103543365 A | 1/2014 |

(Continued)

OTHER PUBLICATIONS

Taiwanese Office Action for related Taiwanese Patent Application No. 105138842 dated Oct. 6, 2017, 7 Pages.

*Primary Examiner* — Son T Le
*Assistant Examiner* — Dustin R Dickinson
(74) *Attorney, Agent, or Firm* — Ditthavong & Steiner, P.C.

(57) ABSTRACT

Methods for enabling in-line detection of TS-PC short defects at the TS-CMP processing stage are provided. Embodiments include providing a semiconductor substrate, the substrate having a plurality of partially formed MOSFET devices; performing a first defect inspection on the substrate, the first inspection including ACC; identifying one or more BVC candidates on the substrate based on the first inspection; performing a second defect inspection on the one or more BVC candidates, the second inspection performed without ACC; and detecting one or more BVC defects on the substrate based on the one or more BVC candidates appearing during both the first and second inspections.

13 Claims, 14 Drawing Sheets

(56) References Cited

U.S. PATENT DOCUMENTS

2010/0278416 A1* 11/2010 Xiao .................. G03F 7/70633
 382/144

FOREIGN PATENT DOCUMENTS

| CN | 103943609 A | 7/2014 |
|---|---|---|
| TW | 201037778 A1 | 10/2010 |
| TW | I409893 B | 9/2013 |
| TW | I512304 B | 12/2015 |

* cited by examiner

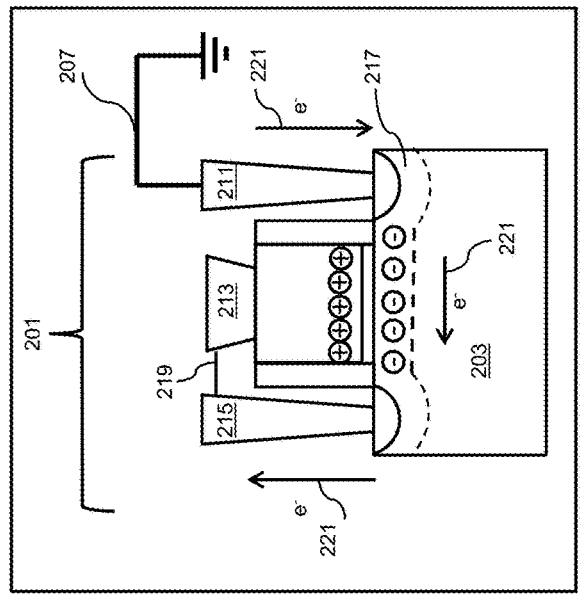
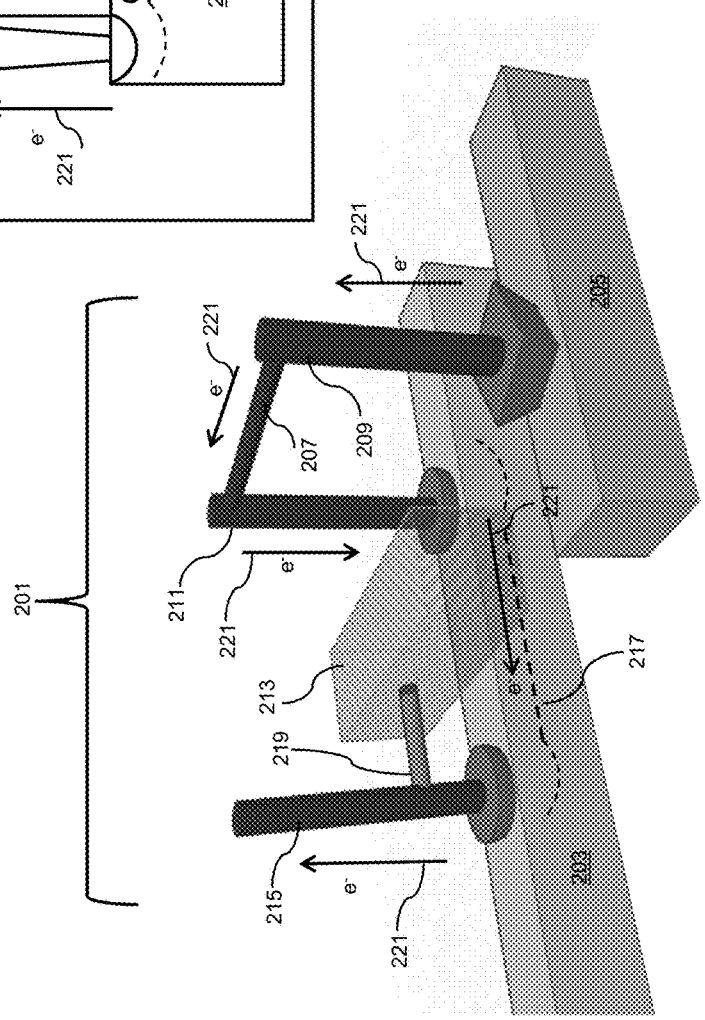
FIG. 2B
FIG. 2A

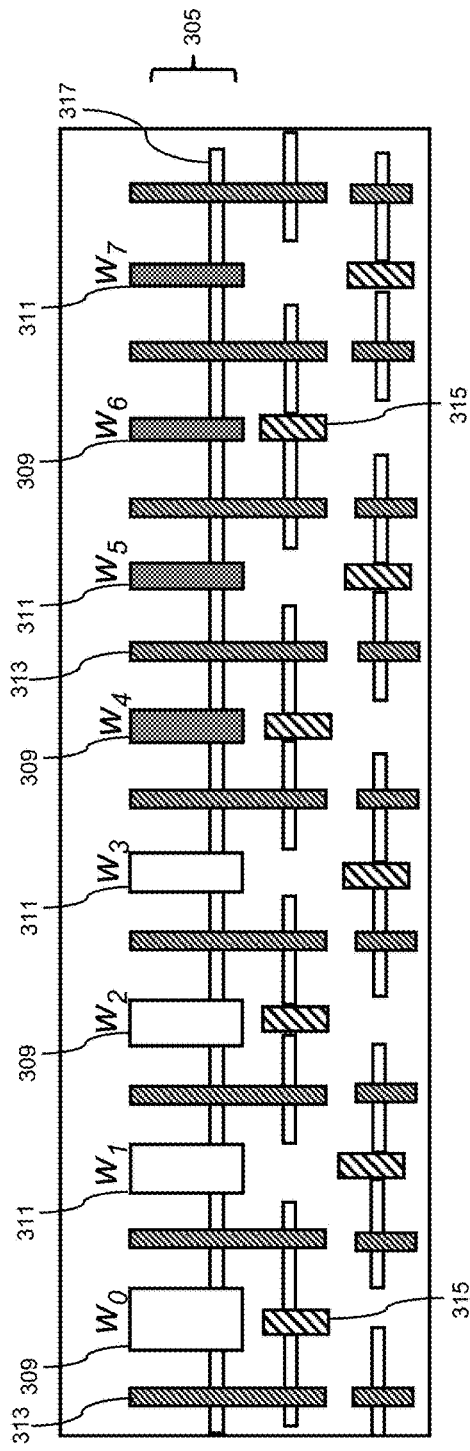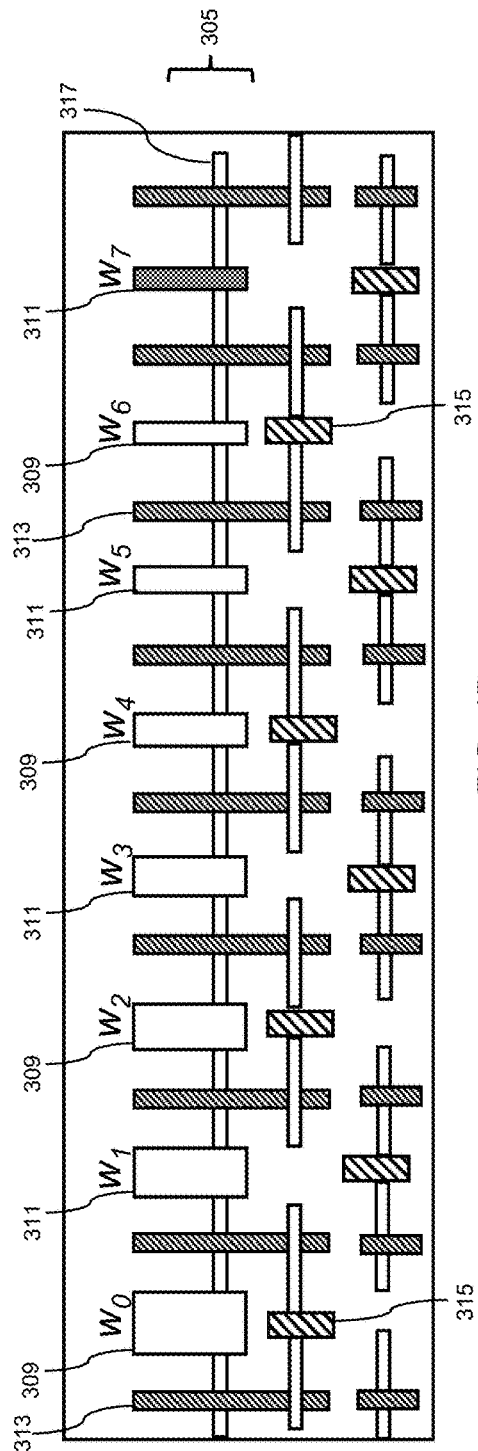
FIG. 4A
FIG. 4B

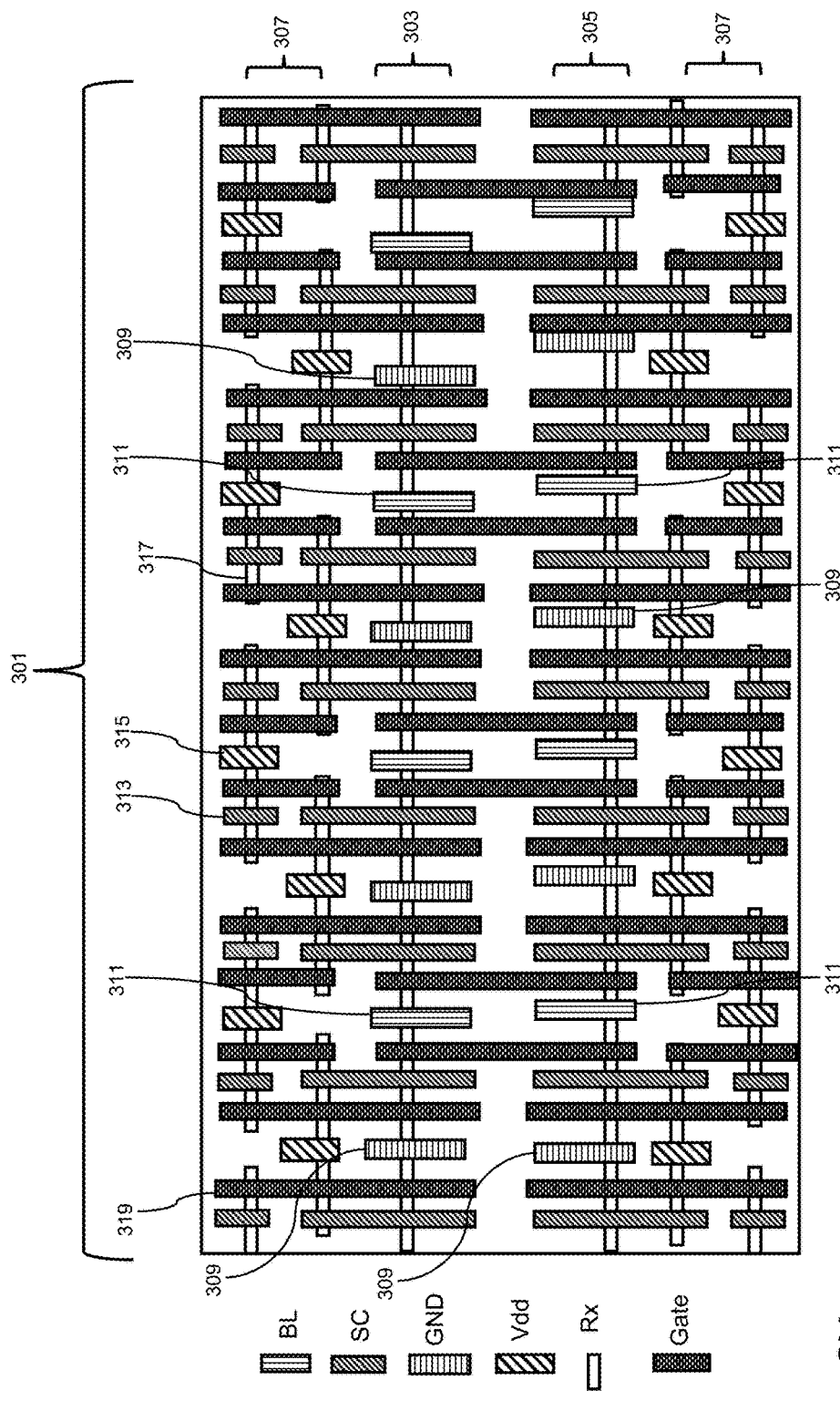
FIG. 7
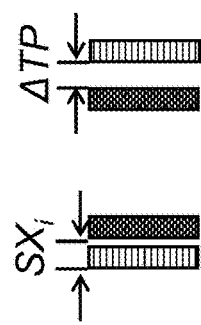

METHODOLOGY FOR EARLY DETECTION OF TS TO PC SHORT ISSUE

TECHNICAL FIELD

The present disclosure relates to a manufacture of metal-oxide-semiconductor field-effect transistor (MOSFET) devices. The present disclosure is particularly applicable to detecting source/drain (TS) to gate (PC) (TS-PC) shorts for the 14 nanometer (nm) technology node and beyond.

BACKGROUND

TS-PC short defects are some of the most common and detrimental failure mechanisms for advanced process technology development in MOSFET device manufacturing. In-line detection of TS-PC short defects is especially challenging for new shorting mechanisms that can occur on an atomic scale due to new material/process flow implementation. Generally, critical TS-PC short defects cannot be detected by optical inspection methodology due to both resolution and contrast limitations.

Electron beam inspection (EBI) has been the most popular in-line detection method for detecting TS-PC electric defects at the gate contact (CB) chemical mechanical polishing (CMP) (CB-CMP) stage of device processing. Currently, CB-CMP is the only check point for TS-PC short defects. However, the cycle time is too long and, therefore, a defect may already be present at the TS-CMP stage. Detection of TS-PC short defects at the TS-CMP stage is currently not possible due to fundamental challenges. Early detection of TS-PC short defects at the TS-CMP stage is of great practical value in terms of cycle time, early warning of process excursion, and reducing costs for high volume manufacturing.

A need therefore exists for methodology enabling in-line detection of TS-PC defects at the TS-CMP processing stage.

SUMMARY

An aspect of the present disclosure is a method of dual condition physics filtering and/or bright voltage contrast (BVC) nuisance suppression to enable in-line detection of TS-PC short defects at the TS-CMP processing stage.

Another aspect of the present disclosure is a method of detecting TS-PC short defects through channel assisted conduction (CAC) based on a share contact (SC) design at the TS-CMP layer.

A further aspect of the present disclosure is a method of monitoring and measuring TS-PC overlay (OVL) shift and process window variation based on in-line EBI scan results.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: providing a semiconductor substrate, the substrate having a plurality of partially formed MOSFET devices; performing a first defect inspection on the substrate, the first inspection including advanced charging control (ACC); identifying one or more BVC candidates on the substrate based on the first inspection; performing a second defect inspection on the one or more BVC candidates, the second inspection performed without ACC; and detecting one or more BVC defects on the substrate based on the one or more BVC candidates appearing during both the first and second inspections. Aspects of the present disclosure include the first and second defect inspections being EBI. Other aspects include each of the one or more BVC defects being a source/drain to gate short.

Another aspect of the present disclosure is a method including: forming a static random-access memory (SRAM) device with at least one n-node, at least one p-node, and at least one share contact, the at least one share contact connecting the at least one n-node to the at least one p-node; determining an upper limit of a threshold voltage (Vt) for the n-node; applying a voltage less than or equal to the upper limit to at least one source/drain (S/D) of the n-node; and determining whether a TS-PC short is present on the n-node based on the application of the voltage. Aspects of the present disclosure include the at least one p-node functioning as a virtual ground for the n-node. Other aspects include the Vt being less than one-half of the at least one S/D voltage (Vd). Further aspects include determining whether the TS-PC short is present based on CAC caused by an EBI.

A further aspect of the present disclosure is a method including: providing a test device for OVL shift monitoring and measurement, the test device having an n-node, a p-node, and a plurality of ground (GND), bit line (BL), SC, voltage supply (Vdd), active channel region (Rx), and gate structures; modifying a width, a height, and/or a position of one or more BL and/or GND structures on one or more rows of the n-node; performing an EBI on the one or more rows of the n-node; determining an order of OVL shift between a TS and PC of the n-node based on BVC results from the EBI; and determining a measure of the OVL shift in an X-direction or a Y-direction based on the BVC results.

Aspects of the present disclosure include determining the order of the OVL shift in an X-direction by: modifying a width of sequential BL and GND structures on the one or more rows of the n-node. Other aspects include determining at least one process window variation and/or at least one TS misalignment based on the BVC results. Further aspects include, wherein the measure of the OVL shift is based on the at least one process window variation, modifying the width of the BL or GND structures by: adjusting a first BL or GND structure so that the first BL or GND structure just starts touching adjacent gate contacts; and modifying the width of the sequential BL or GND structures until a last BL or GND structure on the one or more rows can no longer be subsequently printed. Additional aspects include, wherein the measure of the OVL shift is based on the at least one TS misalignment, modifying the width by: starting with a first width of a first BL or GND structure; and modifying the width of the sequential BL or GND structures until a last BL or GND structure on the one or more rows can no longer be subsequently printed. Another aspect includes determining the measure of OVL shift in a +X or −X direction by: disconnecting a first group of SC structures for a first row and a second group of SC structures for a second row of the one or more rows on the n-node before modifying the width of sequential BL and GND structures on the first and second rows. Other aspects include determining the measure of the OVL shift in an X-direction by: modifying a position of sequential BL and GND structures on the one or more rows of the n-node relative to one or more adjacent gate structures, respectively, on the one or more rows; and determining the measure of the OVL shift in a Y-direction by: modifying a position of one or more GND structures on the one or more rows of the n-node relative to one or more Vdd structures, respectively, on one or more adjacent rows on the n-node. Further aspects include determining the measure of the OVL shift in an X or a Y direction by: monitoring an order of the BVC results based on the modification. Additional aspects include determining the measure of the OVL shift in an +X or −X or a +Y or −Y direction, respectively, by: determining which row of the one or more rows corresponding to the BVC results are dominant. Another aspect includes determining the order of the OVL shift in a Y-direction by: modifying a height of sequential GND structures on the one or more rows of the n-node. Other aspects include the maximum height of the sequential GND structures being limited by a GND to Vdd space along the Y-direction. Further aspects include determining the measure of the OVL shift in the Y-direction by: monitoring an order of the BVC results based on the modification. Additional aspects include determining the measure of the OVL shift in a +Y or −Y direction by: determining which row of the one or more rows corresponding to the BVC results are dominant.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 2A and 2B schematically illustrate a SC design that enables in-line detection of TS-PC short defects by CAC and the physical principle of CAC under ebeam exposure, respectively, in accordance with an exemplary embodiment;

FIGS. 4A and 4B schematically illustrate a simulation case of the TS misalignment measure from the test structure of FIGS. 3A and 3B, in accordance with an exemplary embodiment;

FIG. 7 schematically illustrates a test structure for in-line monitoring and measurement of OVL shift in an X-direction based on contact position modulation, in accordance with an exemplary embodiment;

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of an inability to detect TS-PC short defects in-line at the TS-CMP processing stage attendant upon EBI inspection during MOSFET device formation.

Methodology in accordance with embodiments of the present disclosure includes providing a semiconductor substrate, the substrate having a plurality of partially formed MOSFET devices. A defect inspection is performed on the substrate, in which the inspection includes ACC. One or more BVC candidates on the substrate are identified based on the inspection, and a second defect inspection is performed on the one or more BVC candidates, the second inspection being performed without ACC. One or more BVC defects are then detected on the substrate based on the one or more BVC candidates appearing during both inspections.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
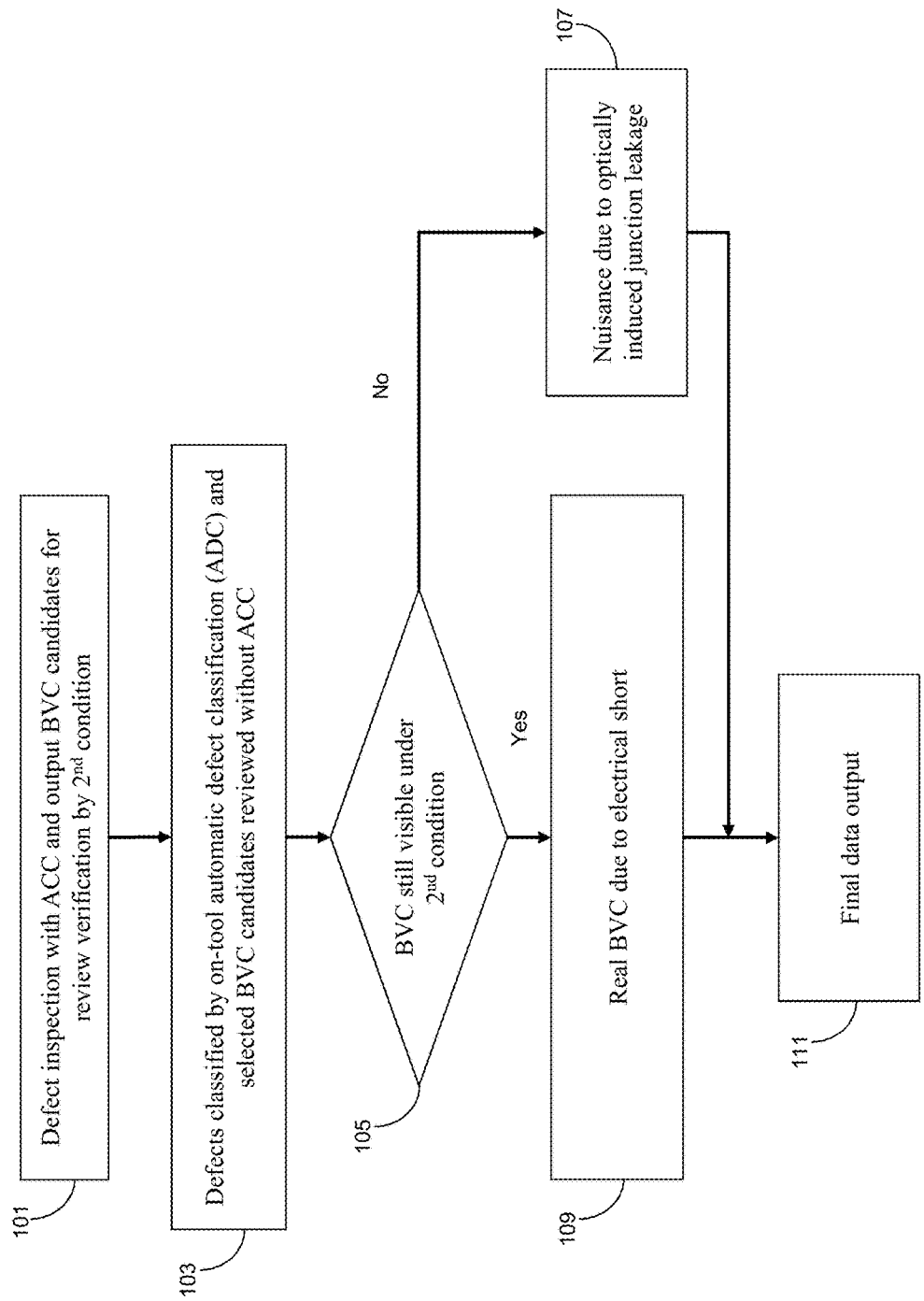
FIG. 1 illustrates a process flow for dual condition physics filtering and/or BVC nuisance suppression to enable in-line detection of TS-PC short defects at the TS-CMP processing stage, in accordance with an exemplary embodiment.

FIG. 1 illustrates a process flow for dual condition physics filtering and/or BVC nuisance suppression to enable in-line detection of TS-PC short defects at the TS-CMP processing stage. In step 101, a semiconductor substrate with a plurality of partially formed MOSFET devices is provided for defect inspection, e.g., by EBI. At this stage of device processing, there is no detectable voltage contrast (VC) signal at the TS-CMP level because both the gates and n-nodes of a device are "floating" and, therefore, will appear dark as a result of EBI. In contrast, the p-nodes of the device are grounded and, therefore, will appear bright as a result of EBI. A defect inspection is then performed on the substrate with ACC turned on, e.g., laser radiation from scanning the substrate with an electron beam (ebeam). When ACC is turned on, a more uniform and stable charging state can be obtained, but false BVC results can also occur as a result of junction leakage induced by the optical radiation. Consequently, the results of a defect inspection performed only with ACC on will be overwhelmed by nuisance/noise rate and, therefore, prevent accurate BVC detection.

In step 103, the BVC candidates resulting from the first inspection are classified by on-tool automatic defect classification (ADC), and then the various BVC candidates are inspected again without ACC. By performing the second inspection without ACC, many of the BVC candidates from the first inspection will no longer be visible because of the enhanced n-p junction barrier height without laser illumination. However, simply performing the inspection without ACC is also insufficient because of the resulting nuisance/noise due to non-uniform charging and/or image artifacts.

In step 105, the BVC candidates are examined to determine whether the BVC is still visible after the second inspection. If a BVC candidate from the first inspection is no longer visible after the second inspection, then in step 107, those BVC candidates are determined not to be BVC defects, but rather nuisance due to optically induced leakage. In contrast, if a BVC candidate from the first inspection is still visible after the second inspection, then in step 109, those BVC candidates are determined to be real BVC due to an electrical short, e.g., a TS-PC short. Thus, the second inspection without optical illumination can serve as a physics filter to separate nuisance due to optically induced junction leakage. In step 111, once the one or more BVC candidates are identified as true or real BVC defects on the substrate, the final data is outputted for further device processing.

FIGS. 2A and 2B (an orthographic view and a cross-sectional view) schematically illustrate a SC design that enables in-line detection of TS-PC short defects by CAC and the physical principle of CAC under ebeam exposure, respectively, in accordance with an exemplary embodiment. Adverting to FIG. 2A, a 14 nm SRAM device 201, e.g., a pull-down terminal, is formed with an n-node 203, a p-node 205, and a SC 207, which connects the n-node 203 and the p-node 205 via the S/D contact 209 of the p-node 205 and the S/D contact 211 of the n-node 203. The p-node 205 has a relatively low resistance and, therefore, provides a virtual ground for the neighboring n-node 203. The n-node 203 also includes a gate contact 213, a S/D contact 215, and a channel 217. Further, a TS-PC short, e.g., a STI void, titanium residue, fin crystal defect, or OVL shift, has occurred in the n-node 203 during manufacturing as represented by the bar 219. The design of the SRAM device 201 is limited to the 14 nm technology node and beyond because larger technology nodes, e.g., the 20 nm, do not include share contacts and, therefore, TS-PC short detection at the TS-CMP processing stage is not possible since both the n-node junction and gate contacts are "floating."

To switch "on" the channel 217 and, therefore, to induce the movement of electrons (e−) from the S/D contact 209 through the n-node 203 and ultimately to the S/D contact 215 as represented by the arrows 221, and to enable BVC detection on the shorted n-node 203, there is some upper limit for the threshold voltage (Vt) (e.g., around 0.35-0.4 volts (V)). The upper limit of Vt may be determined or solved, for example, by using the following general equation for the linear region above threshold:

$$I_d \approx 2\mu C_{OX} \frac{W}{L}\left(V_g - V_t - \frac{V_d}{2}\right)V_d.$$

In particular, to switch on the channel 217 to enable BVC on the shorted n-node 203 when $V_g = V_d$, $V_t$ must satisfy $$V_t < \frac{V_d}{2}.$$

Thus, detection of a TS-PC short on the floating n-node 203 is possible when $V_t$ is small enough (the smaller the better) to switch on the channel 217.

The surface potential can be varied by changing the injected ebeam current. The surface potential of the p-node 205 (forward biased P-N junction) under a positive charge condition is basically "pinned" (e.g., around 0.7-0.8 V) and, therefore, results in an almost flat grey level value (GLV) despite increasing the applied ebeam current. In contrast, the reversed biased n-node 203 potential can continue to increase with increased current and the resulting GLV will correspondingly decrease. Without the SC 207, the S/D contacts 211 and 215 would remain floating and, therefore, appear dark despite the presence of the TS-PC short 219.

Figure 3A:
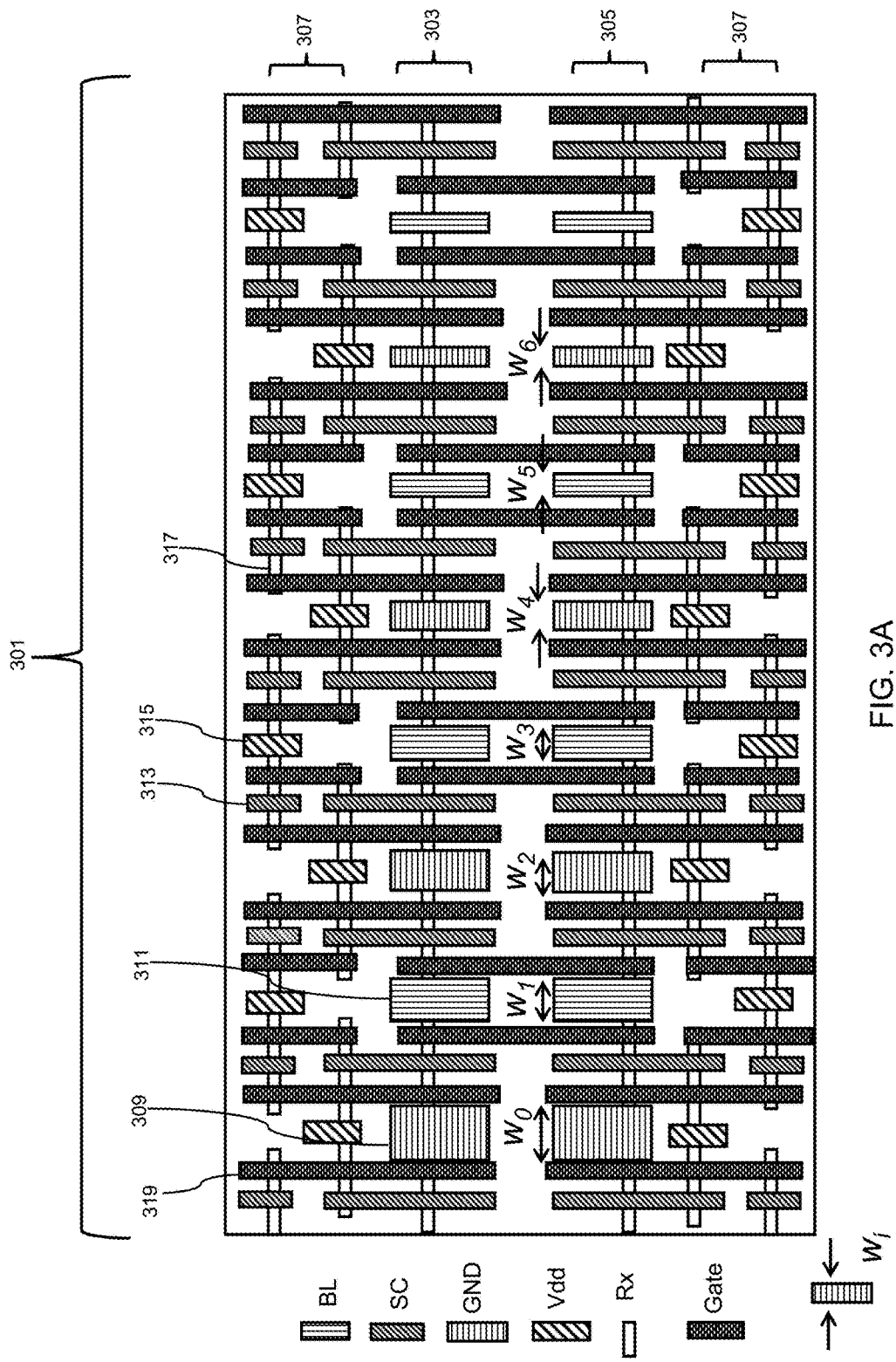
FIGS. 3A and 3B schematically illustrate a test structure for monitoring and measurement of OVL shift in an X-direction based on contact size modulation, in accordance with an exemplary embodiment.
Figure 3B:
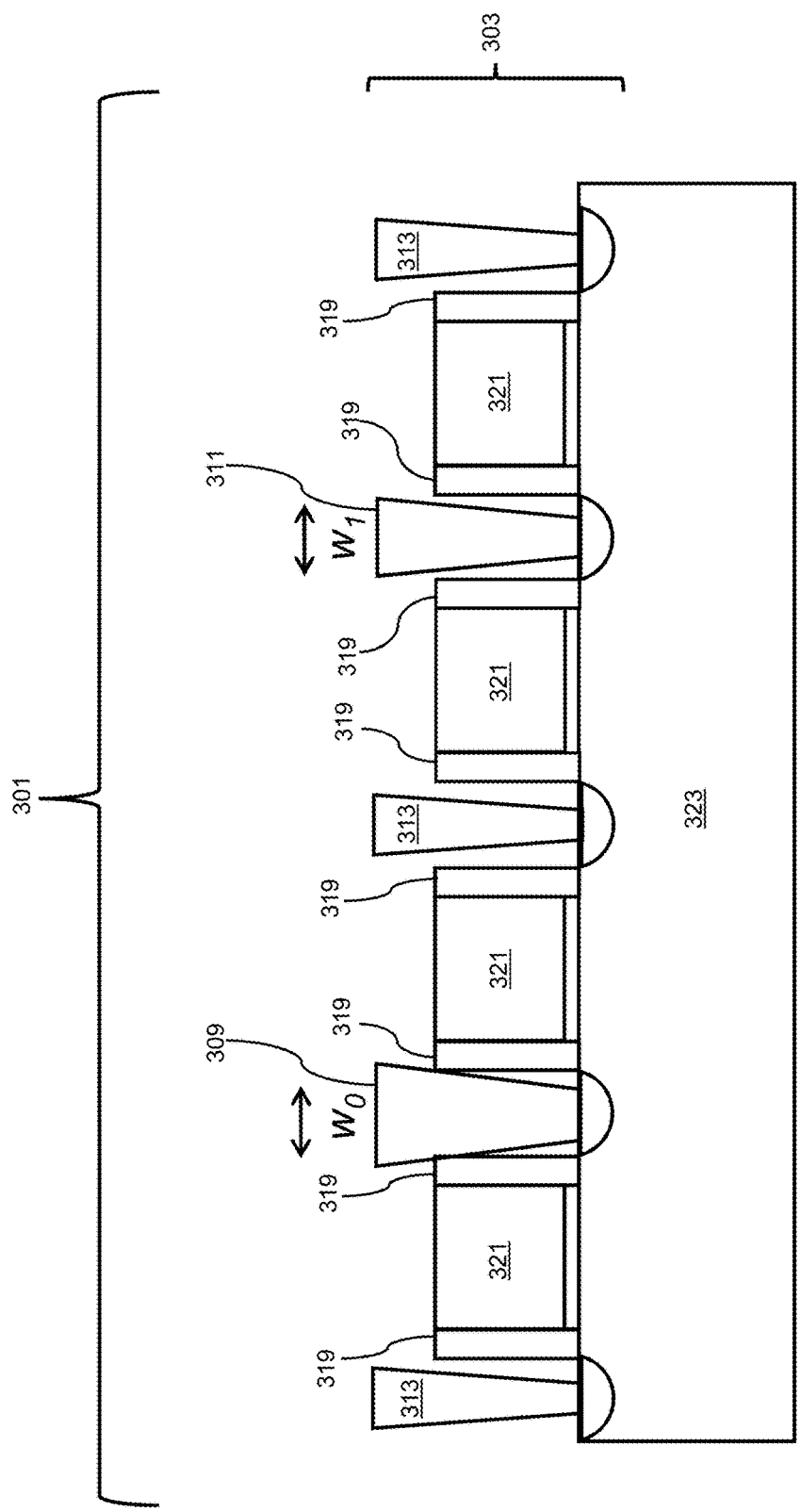

FIGS. 3A and 3B schematically illustrate a test structure for in-line monitoring and measurement of OVL shift in an X-direction based on contact size modulation, according to an exemplary embodiment. Adverting to FIG. 3A, a test device 301 is formed with n-nodes 303 and 305 and a plurality of p-nodes 307. The test device 301 also includes a plurality of GND 309, BL 311, SC 313, Vdd 315, Rx 317, and gate 319 structures. From a junction design point of view, there is no difference between the BL 311 and GND 309 contacts. By continuously varying the width of sequential stand-alone n-node 303 and 305 contacts, e.g., GND 309 and BL 311, a precise metric for TS-PC alignment can be set. For example the width of GND 309 ($W_0$ and $W_2$) and BL 311 ($W_1$ and $W_3$) may be increased and the width of GND 309 ($W_4$ and $W_6$) and BL 311 ($W_5$) may be decreased. By monitoring the order of resulting BVC from exposure to an ebeam scan on the gradually reduced TS contact size where $W_i = W_0 - (i-1) \times \Delta W$, not only can process variation related to a process window be determined, the precise TS misalignment can also be determined from comparison to the order of BVC from a conventional process. Further, the fabrication flow is fully compatible to a conventional process, thus can represent the real process issue of the production chip.

If a precise process window needs to be extracted by this methodology, i.e., an absolute measure of TS-alignment, the starting point of the n-node contact width can be set to where a TS contact, e.g., GND 309, just starts to touch adjacent gate contacts 319 (depending on design rule and process), as depicted in FIG. 3B (a cross-sectional view). Adverting to FIG. 3B, an interlayer dielectric (ILD) 321 is formed between the gate contacts 319, and the SC 313, gate contacts 319, GND 309, and BL 311 are all formed on a substrate 323. The process window of a conventional process can be obtained from the order (f) of observed BVC, i.e., starting from $W_0$ up to $i^{th}$ BVC can be visible from the stand-alone gradually modulated n-node 303 and 305 contacts. The maximum order of modulated TS contact width can be determined from the maximum printability of the corresponding process. Further, the accuracy of the TS misalignment can be determined by the half of the step: $\Delta W/2$. Alternatively, if only TS misalignment needs to be extracted, then the starting point of $W_0$ can be arbitrary since only relative TS misalignment, i.e., relative measure, is needed compared to the conventional process.

FIGS. 4A and 4B schematically illustrate a simulation case based on the test structure of FIGS. 3A and 3B, in accordance with an exemplary embodiment. Specifically, FIG. 4A represents a conventional process window and FIG. 4B represents a TS misalignment. Adverting to FIGS. 4A and 4B, the width of the TS contacts of the n-node 305, e.g., GND 309 or BL 311, have already been modulated as described above, e.g., by increasing the width of TS contacts $W_0$-$W_3$ and by decreasing the width of TS contacts $W_4$-$W_7$. The TS contacts $W_0$-$W_3$ of FIG. 4A appear bright and, therefore, correspond to a TS-PC short, whereas the TS contacts $W_4$-$W_7$ appear dark and, therefore, have no short. For the conventional process, up to $i_1^{th}$ order of BVC is visible from the modulated n-node 305 of the test structure 301 and the conventional process window may be determined, for example, by the equation $$PW = i \times \frac{\Delta W}{2}$$

in the case where W0 starts from the point of just touching adjacent gates 319 (not shown for illustrative convenience).

In contrast, the TS contacts $W_0$-$W_6$ of FIG. 4B appear bright and, therefore, correspond to a TS-PC short, whereas the TS contact $W_7$ appears dark and, therefore, has no short. Compared to the conventional process, up to $i_2^{th}$ order of BVC is visible from the modulated n-node 305 of the test structure 301. The TS misalignment may be determined, for example, from the equation:

$$\Delta_{TS} = (i_2 - i_1) \times \frac{\Delta W}{2}.$$

For determining TS misalignment only relative measure is needed. Consequently, the TS misalignment ($W_4$-$W_6$) may be determined from comparison with the conventional process.

Figure 5:
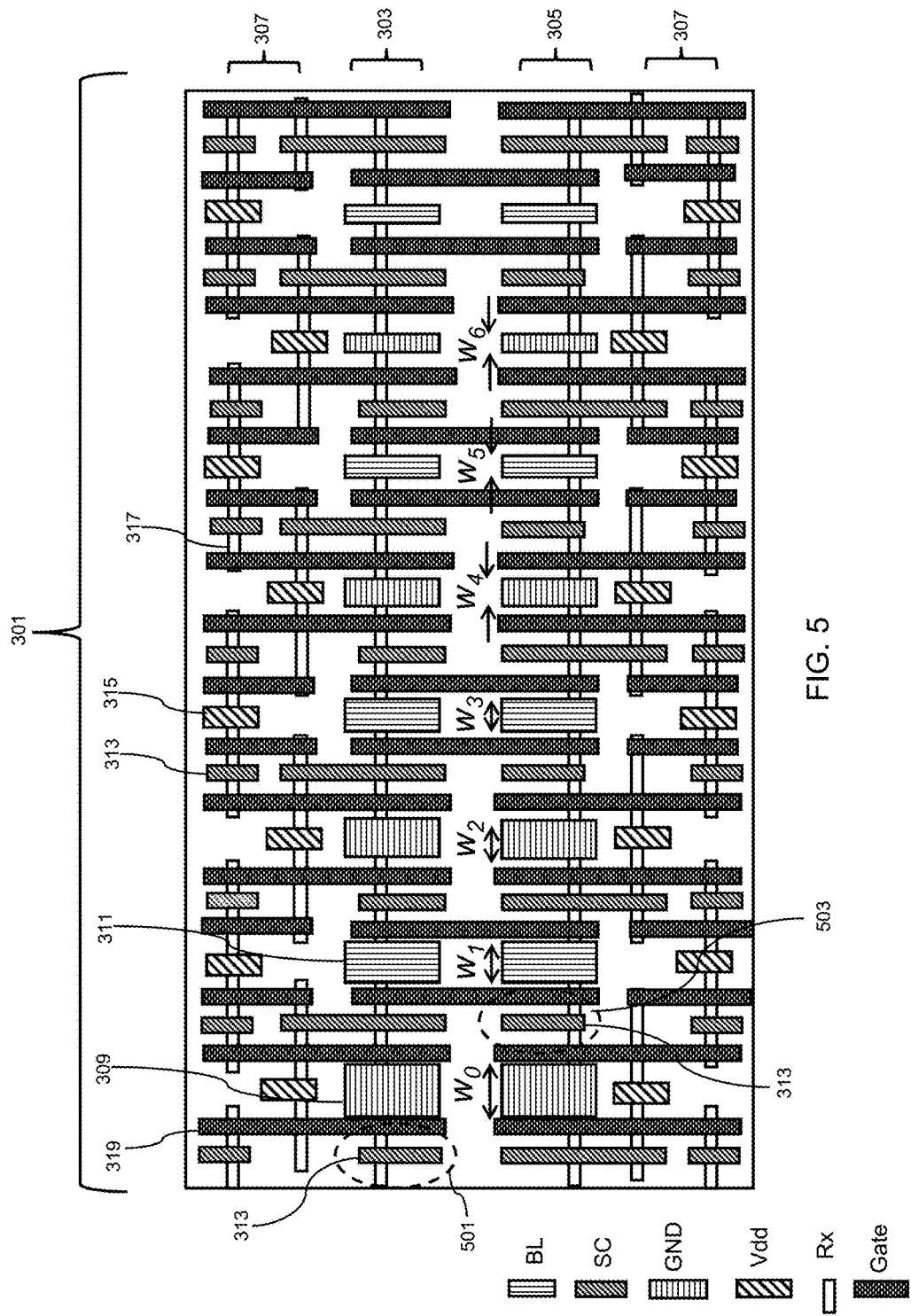
FIG. 5 schematically illustrates a test structure for vector-based in-line monitoring and measurement of OVL shift in an X-direction based on contact size modulation, in accordance with another exemplary embodiment.

FIG. 5 schematically illustrates a test structure for vector-based in-line monitoring and measurement of OVL shift in an X-direction based on contact size modulation, in accordance with another exemplary embodiment. The test device and process flow of FIG. 5 is identical to that of FIG. 3A, except the SC 313 on the left side of the TS contacts of the n-node 303, e.g., GND 309 or BL 311, are disconnected from one of the p-nodes 307, as highlighted by the dashed circle 501, and the SC 313 on the right side of TS contacts on the n-node 305 are disconnected from one of the p-nodes 307, as highlighted by the dashed circle 503. Disconnecting the SC 313 on the left side of the TS contacts on the n-node 303 and the SC 313 on the right side of the TS contacts on the n-node 305 enables a measuring of not only the amount of OVL shift, but also along which direction (+X or −X) the TS misalignment is occurring. Thus, the test device of FIG. 5 yields a vector-based mapping of the OVL shift in an X-direction.

Figure 6A:
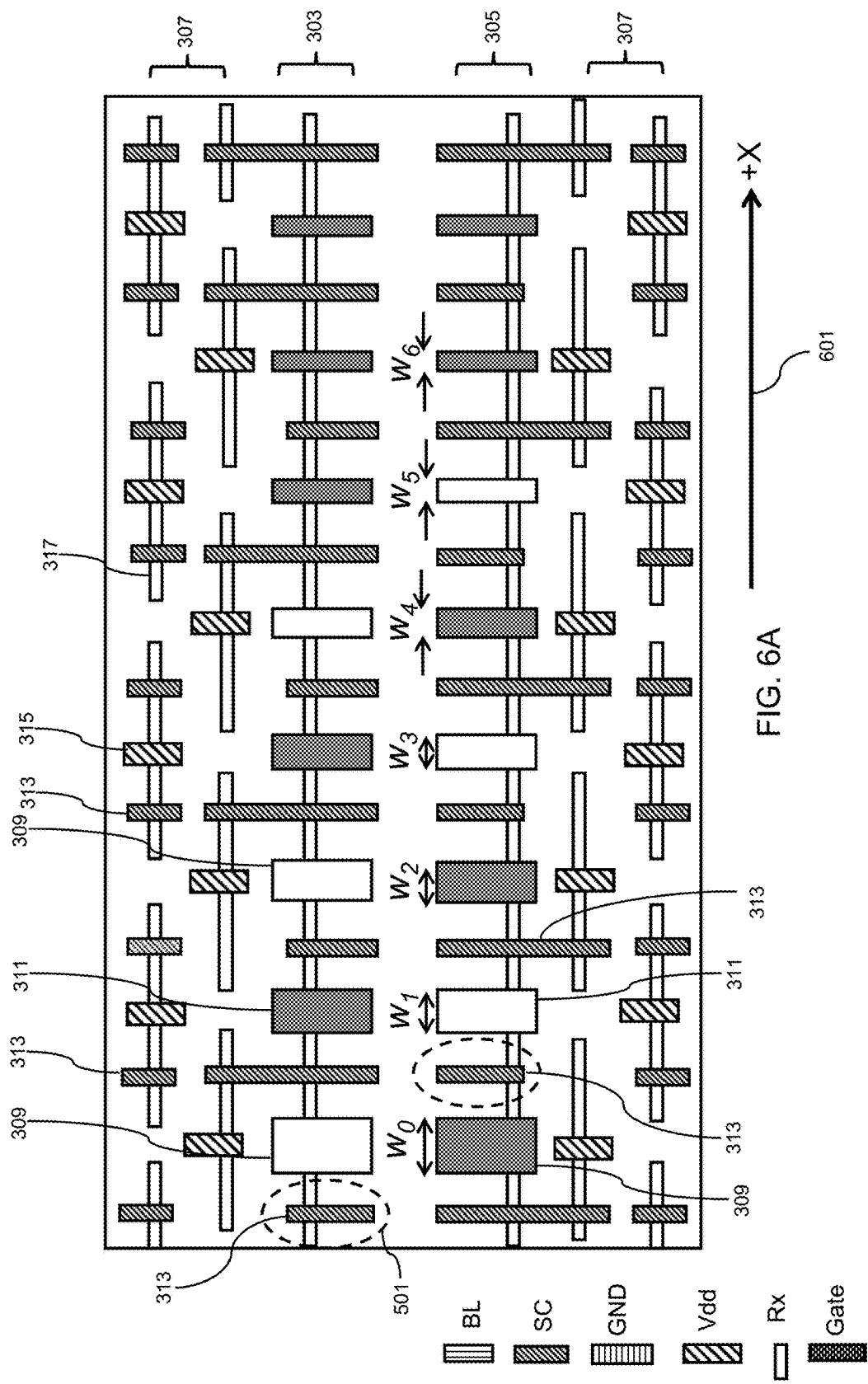
FIGS. 6A and 6B schematically illustrate a simulation case of the TS misalignment measure from the test structure of FIG. 5, in accordance with an exemplary embodiment.
Figure 6B:
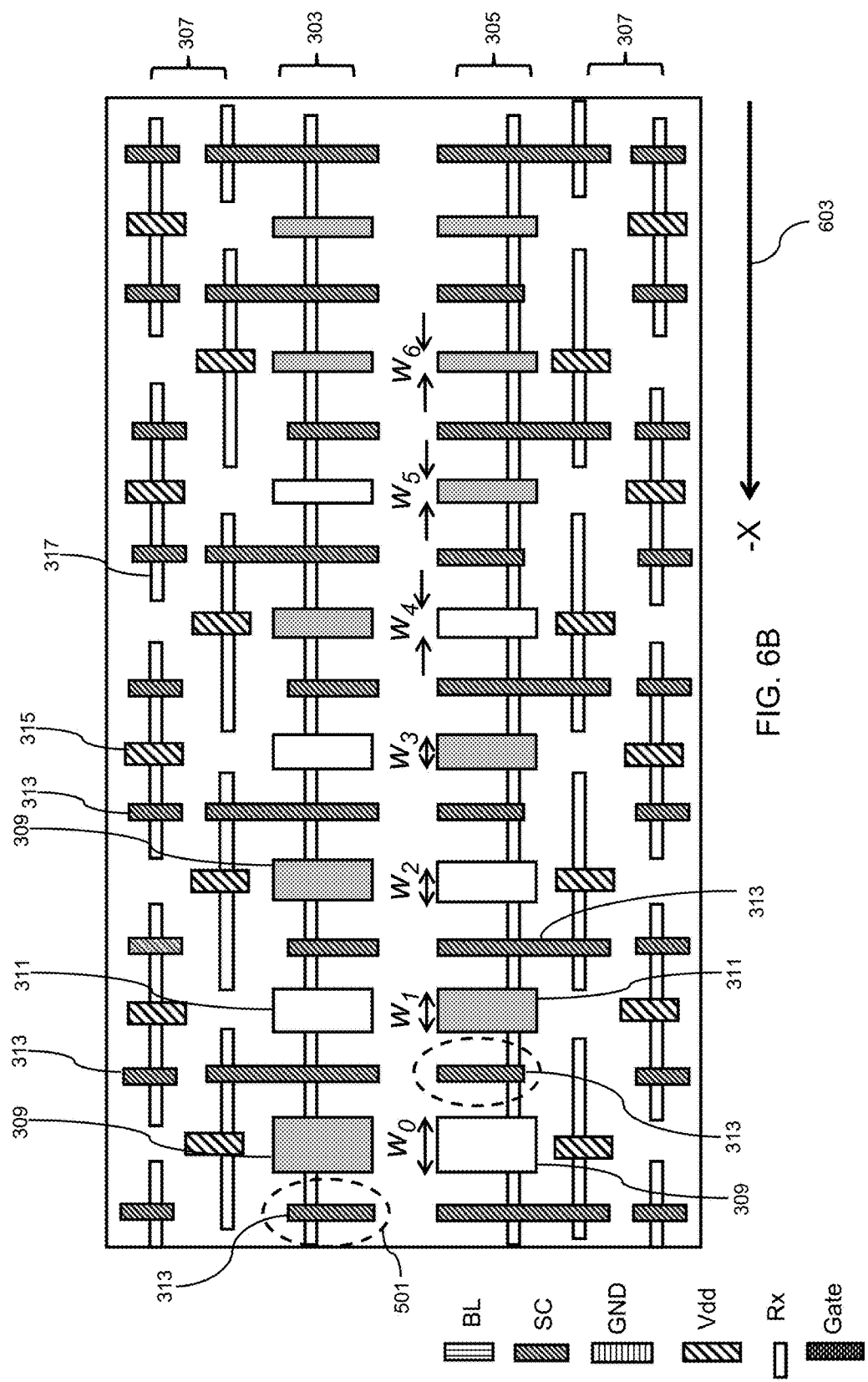

FIGS. 6A and 6B schematically illustrate a simulation case based on the test structure of FIG. 5, in accordance with an exemplary embodiment. Adverting to FIG. 6A, as result of disconnecting the SC 313 on the left side of the TS contacts on the n-node 303 and the SC 313 on the right side of the TS contacts on the n-node 305, the TS contacts, e.g., the BL 311 $W_1$ on the n-node 305 and the GND 309 $W_2$ on n-node 303, can only be bright due to a short/shift to the nearby SC 313, e.g., in the +X direction, as depicted by the arrow 601. Thus, a shift direction can be identified by comparing the particular BVC pattern from two sets of alternatively arranged test structures, e.g., n-nodes 303 and 305. Adverting to FIG. 6B, if the OVL shift is along the opposite X-direction, e.g., −X, then the polarity of the pattern will be reversed, as depicted by the arrow 603.

FIG. 7 schematically illustrates a test structure for in-line monitoring and measurement of OVL shift in an X-direction based on contact position modulation, in accordance with an exemplary embodiment. From a design point of view, FIG. 7 is similar to the starting point of FIG. 3A before any TS contact width modulation. Rather than modulating the size of the TS contacts as in FIG. 3A or FIG. 5, the design of FIG. 7 enables the modulation of the position of a TS contact wherein $SX_i=SX_0+(i-1)\Delta\Delta SX$, while keeping each contact size the same. Adverting to FIG. 7, the TS contacts on the n-node 303 are shifted in one direction, e.g., −X, and the TS contacts on the n-node 305 are shifted in the opposite direction, e.g., +X. The specific direction of the movement of the TS contacts on a particular n-node is not significant as long as one set moves in one direction and the other set moves in the opposite direction. The maximum number of steps is determined by the TS-PC spacing: ATP, i.e., the maximum modulation depth:

$$\frac{\Delta TP}{\Delta SX}.$$

The OVL shift can be determined from the order of the TS BVC due to a TS-PC short, and the OVL shift in an X-direction can be determined from which n-node pattern, e.g., n-node 303 or n-node 305, shows dominant BVC.

Figure 8:
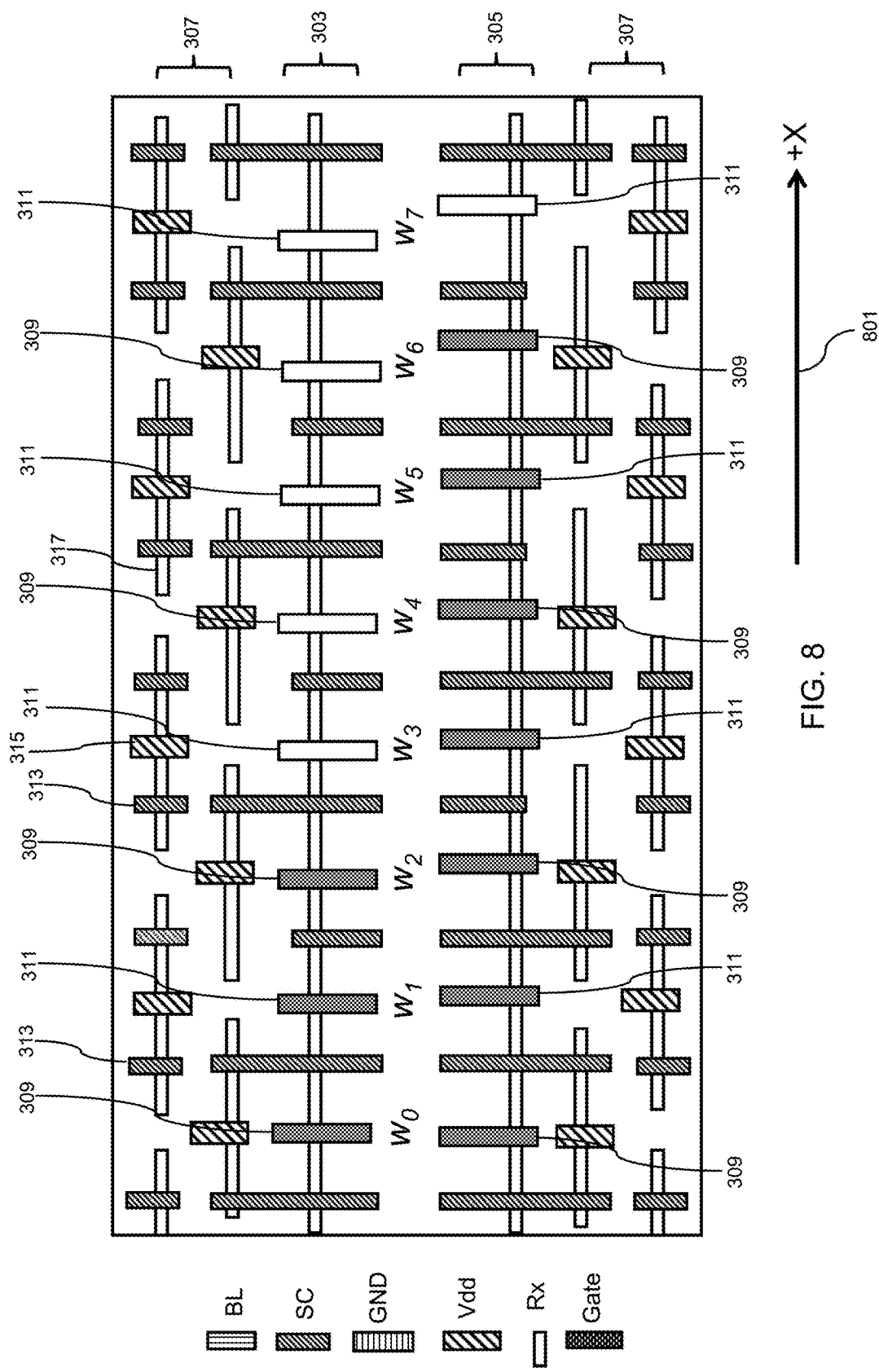
FIG. 8 schematically illustrates a simulation case of the TS misalignment measure from the test structure of FIG. 7, in accordance with an exemplary embodiment.

FIG. 8 schematically illustrates a simulation case of the TS misalignment measure from the test structure of FIG. 7, in accordance with an exemplary embodiment. Adverting to FIG. 8, the OVL shift along the X-direction can be monitored and measured by determining, for example, which n-node pattern row shows dominant BVC. In this case, the row corresponding to the n-node 303 shows a dominant BVC pattern, e.g., BL 311 $W_3$, $W_5$, and $W_7$ and GND 309 $W_4$ and $W_6$ all appear bright. In contrast, only BL 311 $W_7$ of the n-node 305 appears bright. Therefore, the dominant pattern indicates an OVL shift along the +X direction, as depicted by the arrow 801. Relative TS misalignment compared to the conventional process is still valid by comparing BVC order from two wafers.

Figure 9:
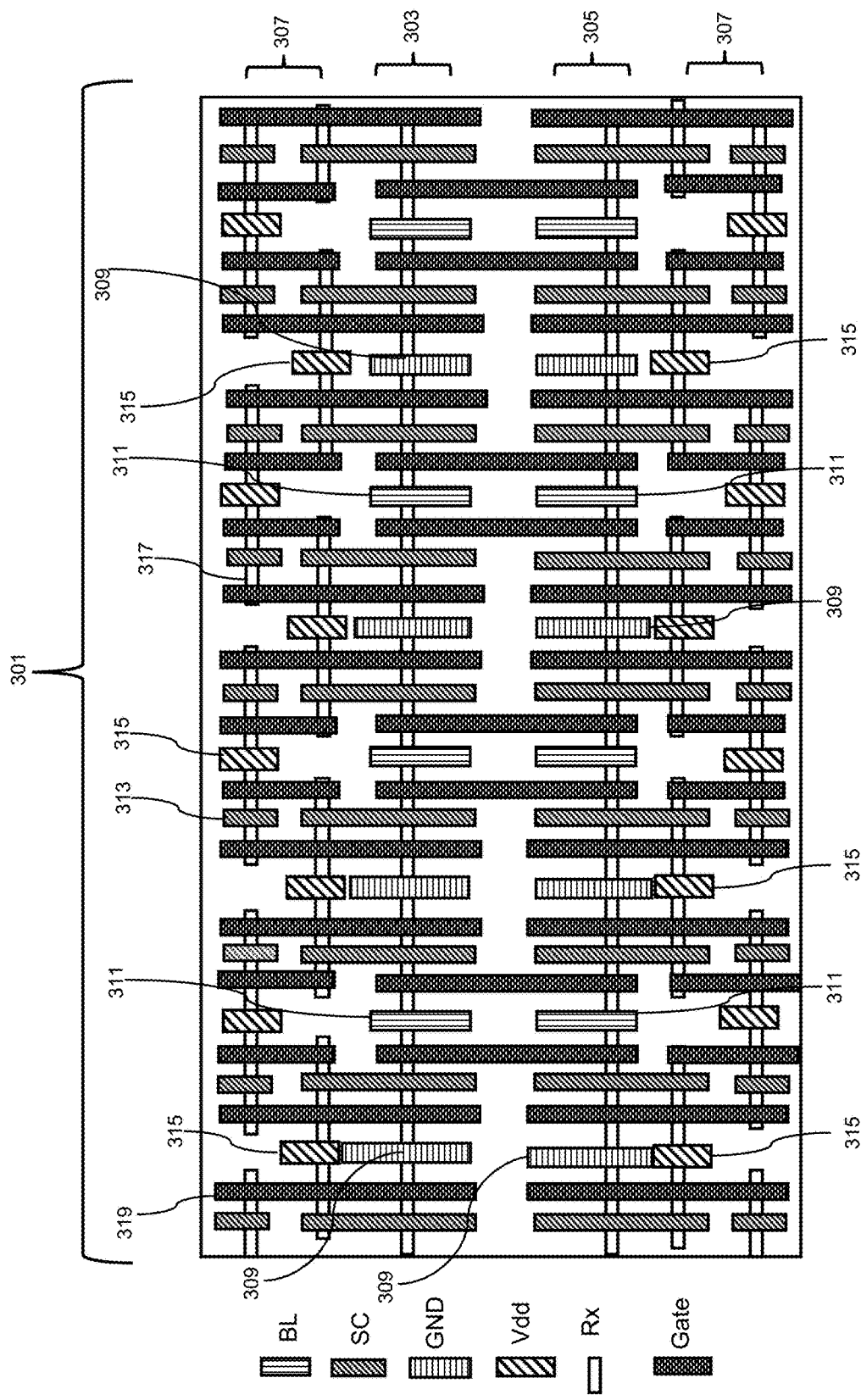
FIG. 9 schematically illustrates a test structure for in-line monitoring and measurement of OVL shift in a Y-direction based on contact size modulation, in accordance with an exemplary embodiment.

FIG. 9 schematically illustrates a test structure for in-line monitoring and measurement of OVL shift in a Y-direction based on contact size modulation, in accordance with an exemplary embodiment. In contrast to FIGS. 3A and 5, the modulation of the one or more TS contacts for Y-shift is only applicable to the GND 309 structures due to their proximity to Vdd 315 on the p-nodes 307, as depicted in FIG. 9. The maximum modulation of GND 309 contact height wherein $H_i=H_0-(i-1)\times\Delta H$ is limited by the GND 309-Vdd 315 spacing along the Y-direction:

$$\frac{\Delta GV}{\Delta H}.$$

Similar to modifying the TS contact size in FIGS. 3A and 5 for a short along the X-direction, by continuously modulating the GND 309 contact size, the OVL shift along a Y-direction can be determined. Further, two sets of modulated GND 309 contact patterns can be used to determine the actual Y-direction shift, e.g., +Y or −Y.

Figure 10:
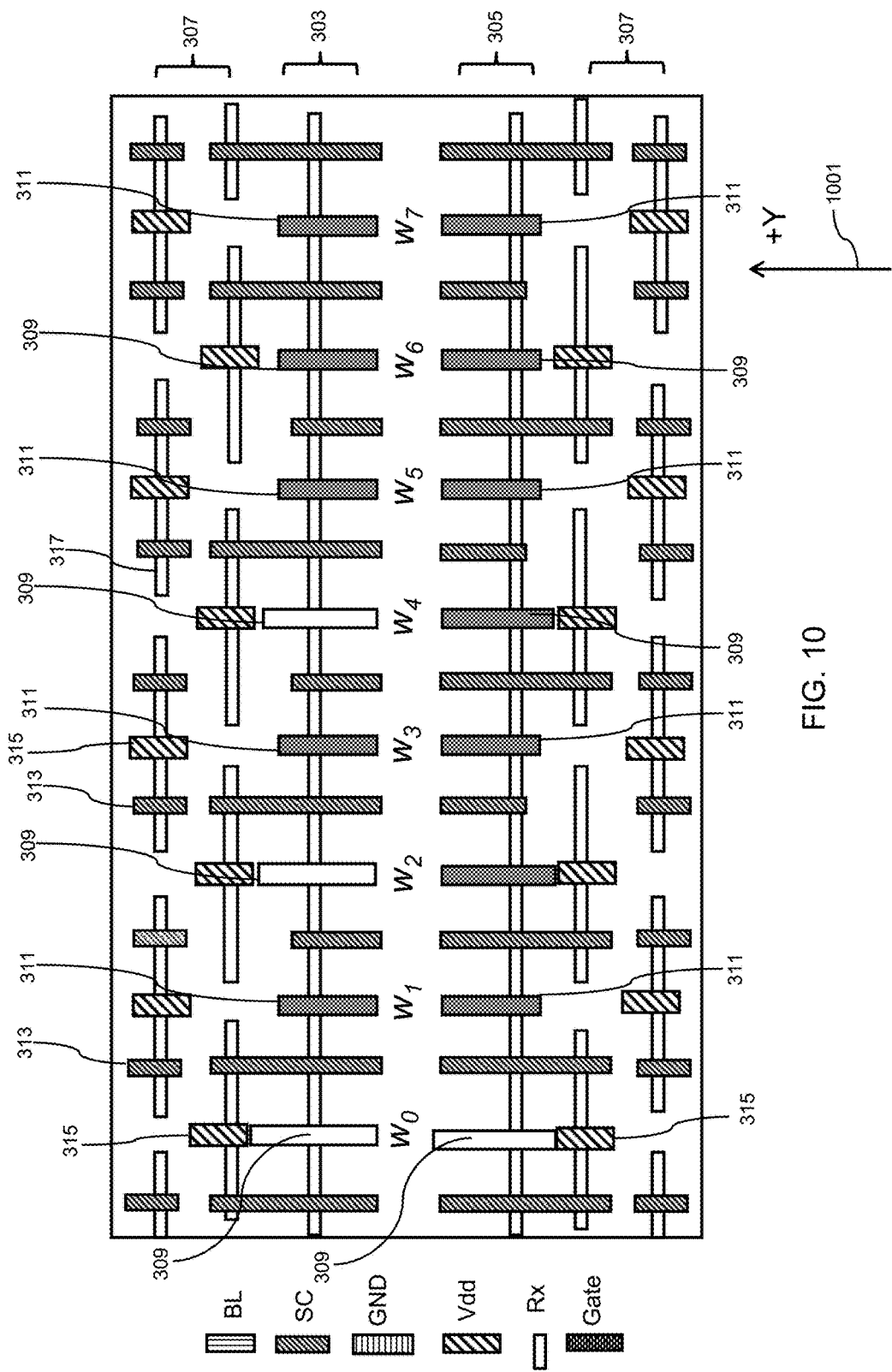
FIG. 10 schematically illustrates a simulation case of TS misalignment measure from the test structure of FIG. 9, in accordance with an exemplary embodiment.

FIG. 10 schematically illustrates a simulation case of TS misalignment measure from the test structure of FIG. 9, in accordance with an exemplary embodiment. Adverting to FIG. 10, similar to determining the OVL shift along an X-direction in FIG. 8, the OVL shift along a Y-direction can be monitored and measured by determining, for example, which n-node pattern row shows dominant BVC. In this case, the GND 309 $W_0$, $W_2$, and $W_4$ of n-node 303 all appear bright, whereas only the GND 309 $W_0$ of n-node 305 appears bright. Therefore, the dominant n-node pattern indicates an OVL shift along the +Y direction, as depicted by the arrow 1001. In particular, the TS misalignment may be determined from the equation $\Delta_Y=(i-1)\times\Delta H$.

Figure 11:
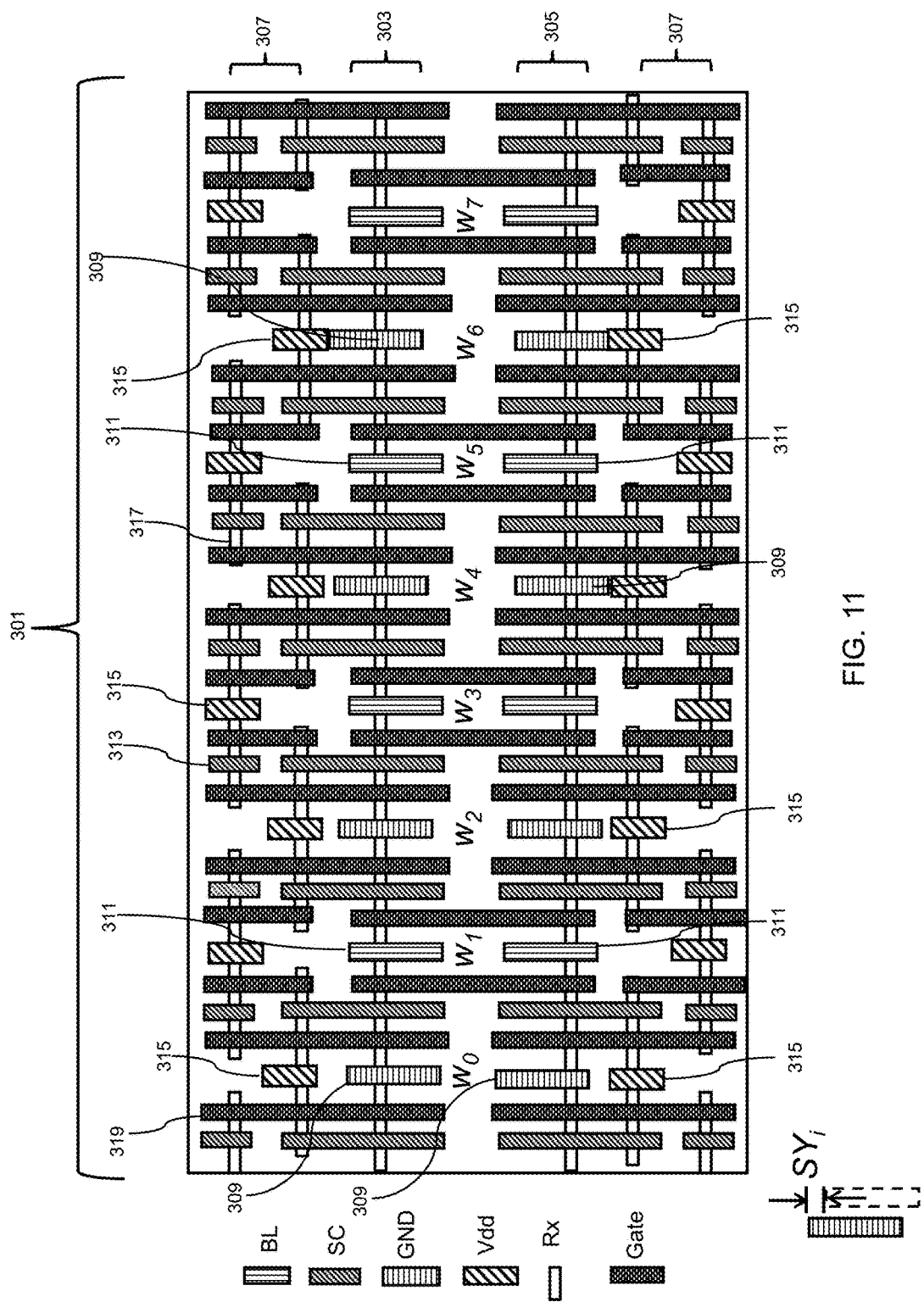
FIG. 11 schematically illustrates a test structure for in-line monitoring and measurement of OVL shift in a Y-direction based on contact position modulation, in accordance with an exemplary embodiment.

FIG. 11 schematically illustrates a test structure for in-line monitoring and measurement of OVL shift in a Y-direction based on contact position modulation, in accordance with an exemplary embodiment. Adverting to FIG. 11, similar to FIG. 9, the possible modulation of the TS contacts is again only applicable to GND 309 and the maximum modulation in GND 309 contact height wherein $SY_i=SY_0-(i-1)\times\Delta SY$ is limited by the GND 309-Vdd 315 spacing along the Y-direction:

$$\frac{\Delta GV}{\Delta SY}.$$

The Y shift is symmetric in both +Y and −Y directions, e.g., one GND pattern shifts in the +Y direction, e.g., the GND 309 of n-node 303, and one GND pattern shifts in the −Y direction, e.g., the GND 309 of n-node 305. Again, the shift direction can be determined from which set of n-node patterns is turned bright from the EBI scan and the shift amount can be determined from the order of the BVC pattern.

Figure 12:
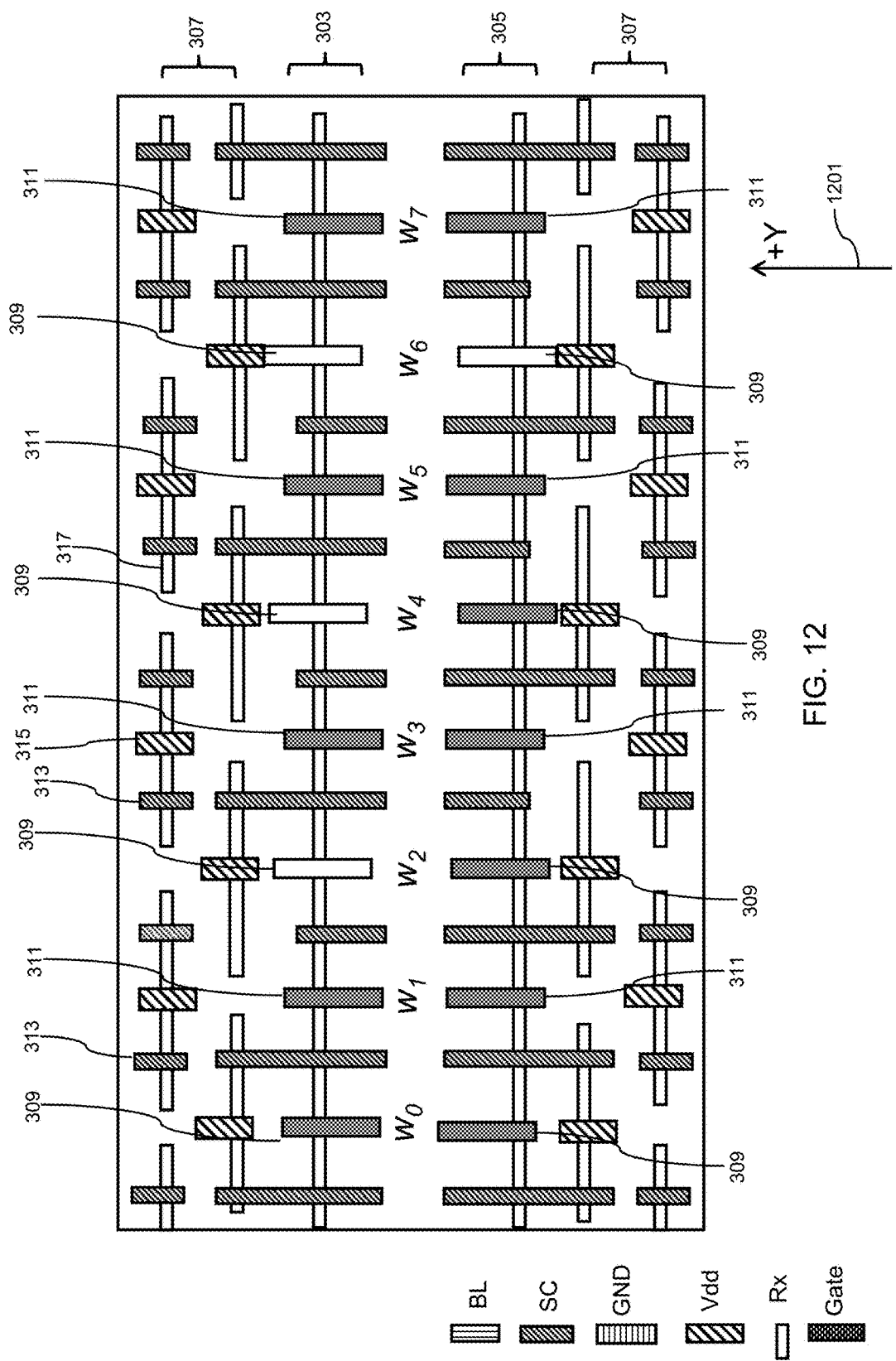
FIG. 12 schematically illustrates a simulation case of TS misalignment measure from the test structure of FIG. 11, in accordance with an exemplary embodiment.

FIG. 12 schematically illustrates a simulation case of TS misalignment measure from the test structure of FIG. 11, in accordance with an exemplary embodiment. Adverting to FIG. 12, similar to determining the OVL shift along the X-direction in FIG. 8, the OVL shift along a Y-direction can be monitored and measured by determining, for example, which n-node pattern row shows dominant BVC. In this case, the GND 309 $W_2$, $W_4$, and $W_6$ of n-node 303 all appear bright, whereas only the GND 309 $W_6$ of n-node 305 appears bright. Therefore, the dominant n-node pattern indicates an OVL shift along the +Y direction, as depicted by the arrow 1201. Again, the TS misalignment may be determined from the equation $\Delta_Y=(i-1)\times\Delta H$.

The embodiments of the present disclosure can achieve several technical effects including dual condition physics filtering to effectively separate nuisance and enable detection of ground true electric short defects; enabling in-line detection of TS-PC short through CAC based on a SC design at the TS-CMP layer; eliminating resolution limitations; being fully compatible with a conventional process and, therefore, can represent the real process issue of chip production; and providing real time and reliable characterization beyond OVL control limit. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of the 14 nm technology node and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
providing a test device for overlay (OVL) shift monitoring and measurement, the test device having an n-node, a p-node, and a plurality of ground (GND), bit line (BL), share contact (SC), voltage supply (Vdd), active channel region (Rx), and gate structures;
modifying a width, a height, and/or a position of one or more BL and/or GND structures on one or more rows of the n-node;
performing an electron beam inspection (EBI) on the one or more rows of the n-node;
determining an order of OVL shift between a source/drain (TS) and gate (PC) of the n-node based on bright voltage contrast (BVC) results from the EBI; and
determining a measure of the OVL shift in an X-direction or a Y-direction based on the BVC results.

2. The method according to claim 1, comprising determining the order of the OVL shift in an X direction by:
modifying the width of sequential BL and GND structures on the one or more rows of the n-node.

3. The method according to claim 2, comprising determining at least one process window variation and/or at least one TS misalignment based on the BVC results.

4. The method according to claim 3, wherein the measure of the OVL shift is based on the at least one process window variation, and the method comprising modifying the width of the BL or GND structures by:
adjusting a first one of the one or more BL or GND structures so that the first one of the one or more BL or GND structures contacts adjacent gate contacts; and
modifying the width of sequential BL or GND structures.

5. The method according to claim 3, wherein the measure of the OVL shift is based on the at least one TS misalignment, the method comprising modifying the width by:
forming a first width of one of the one or more BL or GND structures; and
modifying the width of sequential BL or GND structures until a last one of the one or more BL or GND structures on the one or more rows can no longer be subsequently printed.

6. The method according to claim 2, comprising determining the measure of OVL shift in a +X or −X direction by:
disconnecting a first group of SC structures for a first row of the one or more rows and a second group of SC structures for a second row of the one or more rows on the n-node before modifying the width of sequential BL and GND structures on the first and second rows.

7. The method according to claim 1, comprising:
  determining the measure of the OVL shift in an X-direction by:
    modifying a position of sequential BL and GND structures on the one or more rows of the n-node relative to one or more adjacent gate structures, respectively, on the one or more rows; and
  determining the measure of the OVL shift in a Y-direction by:
    modifying a position of one or more GND structures on the one or more rows of the n-node relative to one or more Vdd structures, respectively, on one or more adjacent rows on the n-node.

8. The method according to claim 7, comprising determining the measure of the OVL shift in an X or a Y direction by:
  monitoring an order of the BVC results based on the modifying.

9. The method according to claim 7, comprising determining the measure of the OVL shift in an +X or −X or a +Y or −Y direction, respectively, by:
  determining which row of the one or more rows corresponding to the BVC results are dominant.

10. The method according to claim 1, comprising determining the order of the OVL shift in a Y-direction by:
  modifying a height of sequential GND structures on the one or more rows of the n-node.

11. The method according to claim 10, wherein the maximum height of the sequential GND structures is limited by a GND to Vdd space along the Y-direction.

12. The method according to claim 10, comprising determining the measure of the OVL shift in the Y-direction by:
  monitoring an order of the BVC results based on the modifying modification.

13. The method according to claim 10, comprising determining the measure of the OVL shift in a +Y or −Y direction by:
  determining which row of the one or more rows corresponding to the BVC results are dominant.

* * * * *